United States Patent
Hafizi et al.

(10) Patent No.: US 8,896,353 B2
(45) Date of Patent: Nov. 25, 2014

(54) METHOD AND APPARATUS FOR CONSTANT OUTPUT IMPEDANCE, VARIABLE PRE-EMPHASIS DRIVE

(75) Inventors: Madjid Hafizi, San Diego, CA (US); Jie Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/564,375

(22) Filed: Aug. 1, 2012

(65) Prior Publication Data
US 2014/0035625 A1    Feb. 6, 2014

(51) Int. Cl.
H03K 3/00 (2006.01)
H04L 25/03 (2006.01)
H04L 25/02 (2006.01)
H03K 17/06 (2006.01)
H03K 17/30 (2006.01)

(52) U.S. Cl.
CPC .......... *H03K 17/30* (2013.01); *H04L 25/03343* (2013.01); *H04L 25/0278* (2013.01); *H04L 25/028* (2013.01); *H03K 17/06* (2013.01)
USPC ............................. 327/108; 326/82; 333/17.3

(58) Field of Classification Search
USPC .......... 327/108–112, 126; 326/26–30, 82–87; 333/17.3
See application file for complete search history.

(56) References Cited

U.S. PATENT DOCUMENTS

| | | | |
|---|---|---|---|
| 7,109,759 B2 * | 9/2006 | Tseng | 326/115 |
| 7,551,897 B1 * | 6/2009 | Savoj | 455/43 |
| 7,888,968 B2 * | 2/2011 | Dreps et al. | 326/82 |
| 7,919,984 B2 | 4/2011 | Balamurugan et al. | |
| 7,949,041 B2 | 5/2011 | Zerbe et al. | |
| 8,023,584 B2 | 9/2011 | Zerbe et al. | |
| 2007/0075745 A1 | 4/2007 | Song et al. | |
| 2008/0284466 A1 | 11/2008 | Cranford, Jr. et al. | |
| 2012/0032656 A1 | 2/2012 | Hoon et al. | |

FOREIGN PATENT DOCUMENTS

EP    2375662 A1    10/2011

OTHER PUBLICATIONS

International Search Report and Written Opinion—PCT/US2013/052763—ISAEPO—Oct. 2, 2013.

* cited by examiner

*Primary Examiner* — Lincoln Donovan
*Assistant Examiner* — Thomas Skibinski
(74) *Attorney, Agent, or Firm* — Paul S. Holdaway (57) ABSTRACT

A population of drivers is provided in parallel to a driver output and a population of pre-emphasis path drivers is provided in parallel to the driver output. The population of drivers is updated and the population of pre-emphasis path drivers is updated in an inverse relation to the updating of the population of pre-emphasis path drivers. Optionally, the population of drivers has an initial value of n and the population of pre-emphasis path drivers has an initial value of m, and the sum of n and m is P. Optionally, the updated population of n is n' and the updated population of m is m', and n' is approximately equal to P−m'.

12 Claims, 3 Drawing Sheets

METHOD AND APPARATUS FOR CONSTANT OUTPUT IMPEDANCE, VARIABLE PRE-EMPHASIS DRIVE

FIELD OF DISCLOSURE

The present Application for Patent relates to line drivers, more particularly, to pre-emphasis transmission line drivers.

BACKGROUND

In systems for communicating high bit rate signals over a transmission line, a transmission amplifier or driver can be provided with a particular frequency-based gain. For example, when plotted on a frequency versus gain graph the gain can exhibit a particular shape. This is generally referred to as "pre-emphasis," The pre-emphasis can be applied for various reasons. For example it can be applied to compensate a frequency characteristic of the transmission line, either ab initia or arising from a particular impairment. The pre-emphasis can be variable, for example to assist in maintaining an adequate eye-opening as data rates are increased. Variable pre-emphasis can be used to synthesize different channel conditions, for example to test with different training sequences.

Concurrently, though, a general objective in the design and operation of a system for communicating high rate signals over a transmission line is a match between the output impedance of the line driver, the impedance of the transmission line, and the input impedance of the receiver(s), in other words the loads on the transmission line. If there is an impedance mismatch there is reduced efficiency in signal power transfer and, often, a related distortion of the received signal.

With respect to the impedance of the transmission line and the impedance at the input of transmission line receivers, various techniques are known for establishing and controlling these values. These techniques can utilize the fact that the transmission line and the input of the receiver(s) can be passive elements. Designs providing acceptable stability of their respective impedance can therefore be straightforward.

However, voltage mode drivers can be preferable for pre-emphasis, and both setting and maintaining a target impedance of voltage mode drivers can have difficulties.

SUMMARY

The following summary is not an extensive overview of all contemplated aspects, and is not intended to identify key or critical elements of all aspects nor delineate the scope of any aspect. Its sole purpose is to present some concepts of one or more aspects in a simplified form as a prelude to the more detailed description that is presented later.

One method for pre-emphasis through line drivers in accordance with one embodiment can include providing a population of drivers in parallel to a driver output, providing a population of pre-emphasis path drivers in parallel to the driver output, updating a pre-emphasis by updating the population of pre-emphasis path drivers, and updating the population of drivers in an inverse relation to the updating of the population of pre-emphasis path drivers.

In an aspect of methods according an embodiment, a population of drivers can have an initial value of n and the population of pre-emphasis path drivers can have an initial value of m, where m+n can be=P, and where P can be associated with an output impedance at the driver output.

In an aspect of methods according to an embodiment, the updated population of n is n' and the updated population of m is m', and further, N' can be approximately equal to P−m'.

In one aspect of methods according to an embodiment, the drivers and the pre-emphasis path drivers can be voltage mode drivers.

In another aspect of methods according to an embodiment, a result of the updating a pre-emphasis is an updated population of pre-emphasis path drivers and a result of the updating the population of drivers is an updated population of drivers and, in one further aspect, the sum of the population of drivers added to the population of pre-emphasis path drivers can be a value P, and the sum of the updated population of drivers added to the updated population of pre-emphasis path drivers can remain at the value P.

In another aspect of methods according to an embodiment, providing the population of drivers in parallel can comprise providing a plurality of selectively enabled drivers in parallel and enabling a population from among the selectively enabled drive and, in a related aspect, providing the population of pre-emphasis path drivers in parallel can comprise providing a plurality of selectively enabled pre-emphasis path drivers in parallel and enabling a population from among the selectively enabled pre-emphasis path drivers. In further related aspect, updating the population of drivers can comprise enabling an updated population from among the plurality of selectively enabled drivers, and updating the population of pre-emphasis path drivers can comprise enabling an updated population from among the plurality of selectively enabled pre-emphasis path drivers.

In another aspect of methods according to exemplary embodiments, enabling the population among the selectively enabled drivers can include enabling one or more of the selectively enabled drivers and, in a related aspect, the enabling can provides an output impedance to the one or more of the selectively enabled drivers of P times a specified impedance (R_Line) and, in a further aspect, enabling the population among the selectively enabled pre-emphasis path drivers can include enabling one or more of the selectively enabled pre-emphasis path drivers and, in another aspect, the enabling can provide the one or more of the selectively enabled pre-emphasis path drivers with the output impedance of P times R_Line.

In another aspect of methods according to an embodiment, enabling the population of drivers can including enabling n of the selectively enabled drivers, and enabling the population of pre-emphasis path drivers can include enabling m of the selectively enabled pre-emphasis path drivers and, in a further aspect, m+n=P. In a related aspect, updating the population of drivers comprises updating n to n' and enabling n' of the selectively enabled drivers, and updating the population of pre-emphasis path drivers comprises updating m to m' and enabling m' of the pre-emphasis path drivers from m to m' and, in a further aspect, m'+n'=P.

Example variable pre-emphasis, constant output impedance line drivers according to an embodiment can include a bank of parallel, selectively enabled drivers having respective outputs coupled to an output node, which can be configured to receive a signal and, if enabled, feed the output node, and a bank of parallel, selectively enabled pre-emphasis path drivers having respective outputs coupled to the output node, which can be configured to receive a pre-emphasis signal and, if enabled, feed the output node, and can include a pre-emphasis controller that may be configured to receive a pre-emphasis command and, in response, can enable in of the selectively enabled pre-emphasis path drivers and n of the selectively enabled drivers and, in an aspect, m and n can be in accordance with the pre-emphasis command, and wherein m+n=P.

Methods for pre-emphasis drive according to one exemplary embodiment can include step of providing a population of drivers in parallel to a driver output, step of providing a population of pre-emphasis path drivers in parallel to the driver output, step of updating pre-emphasis characteristic by updating the population of pre-emphasis path drivers, and step of updating the population of drivers in an inverse relation to the updating of the population of pre-emphasis path drivers.

Apparatus for pre-emphasis drive according to one exemplary embodiment can include a population of drivers in parallel to a driver output, a population of pre-emphasis path drivers in parallel to the driver output, means for updating pre-emphasis characteristic by updating the population of pre-emphasis path drivers, and means for updating the population of drivers in an inverse relation to the updating of the population of pre-emphasis path drivers.

In an aspect of one apparatus for pre-emphasis drive according to an exemplary embodiment, means for updating the population of driver can be configured to maintain a sum, where the sum can be the updated population of drivers added to the updated population of pre-emphasis path drivers, at a value P which can be the population of drivers added to the population of pre-emphasis path drivers.

In an embodiment, a computer-readable medium comprises instructions, which, when executed by a processor apparatus coupled to a bank of parallel, selectively enabled drivers coupled to an output and to a bank of parallel, selectively enabled pre-emphasis path drivers coupled to the output, cause the processor apparatus to perform operations carrying out a method for pre-emphasis drive, that can include instructions that cause the processor apparatus to provide a population of the drivers in parallel to the driver output, provide a population of the pre-emphasis path drivers in parallel to the driver output, enable a population of the selectively enabled drivers in parallel to the output, enable a population of the pre-emphasis path drivers in parallel to the output, update a pre-emphasis by updating the population of pre-emphasis path drivers, and update the population of drivers in an inverse relation to the updating of the population of pre-emphasis path drivers.

DETAILED DESCRIPTION

The detailed description set forth below in connection with the appended drawings is intended as a description of exemplary embodiments and is not intended to represent the only embodiments in which the present invention can be practiced. The word "exemplary" (and variants thereof) as used herein means serving as an example, instance, or illustration. Any aspect or design described herein as "exemplary" is not necessarily to be construed as preferred or advantageous over other aspects or designs. Rather, use of the word "exemplary" is only intended to illustrate example applications of concepts using simplified concrete examples.

Various specific details are also described, to facilitate a person of ordinary skill in the art in readily obtaining, through this disclosure in its entirety, a sufficient understanding of relevant concepts to practice according to one or more of the various exemplary embodiments. Such persons, though, upon reading this entire disclosure may see that various embodiments and aspects of one or more embodiments may be practiced without, or with alternatives to one or more of these specific details. In other instances, certain well-known structures and devices are shown in block diagram form to avoid obscuring the various novel ties of the exemplary embodiments.

Various aspects or features will be presented in terms of systems that may include a number of devices, components, modules, and the like. It is to be understood and appreciated that various systems may include additional devices, components, modules, and so forth, and/or may not include all devices, components, modules, and so on, discussed in connection with the figures. A combination of these approaches may also be used.

The terms "engine", "component", "module", "system" and the like, as used herein, are intended to refer to a functional entity, which may be embodied in hardware, firmware, a combination of hardware and software, software, or software in execution. A "component" may be, but is not limited to being, a process running on a processor, a processor, an object, an executable, a thread of execution, a program, and/or a computer. By way of illustration, both an application on a computing device and the computing device can be a component.

The term "includes," as used in either the detailed description or the claims, is intended to be inclusive in a manner similar to the term "comprising" as "comprising" is interpreted when employed as a transitional word in a claim. The term "or," as used in either the detailed description or the claims, is intended to mean an inclusive "or" rather than an exclusive "or." In addition, the articles "a" and "an" as used in this disclosure should generally be construed to mean "one or more" unless specified otherwise or clear from the context to be directed to a singular form.

Figure 1A:
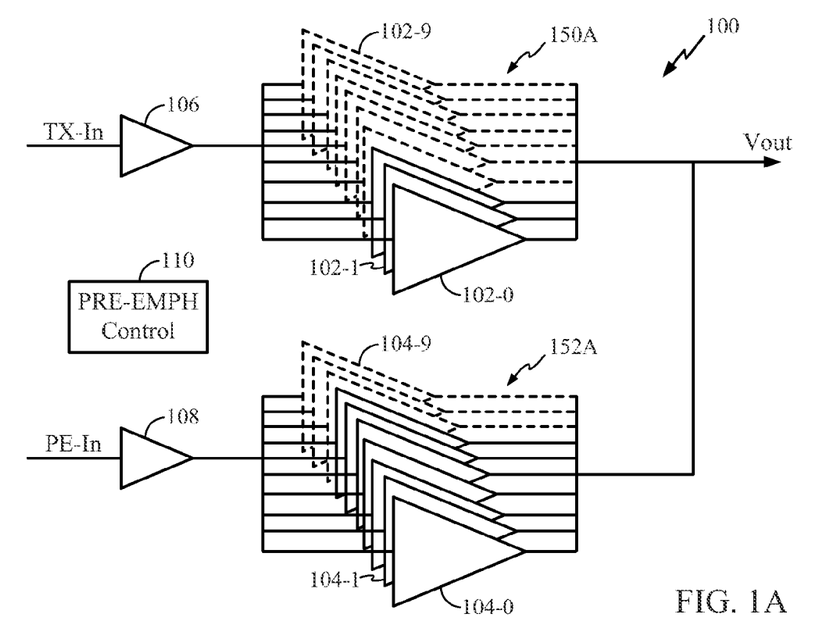
FIG. 1A shows a simplified schematic diagram of one example variable pre-emphasis constant output impedance driver in accordance with one exemplary embodiment, having one arbitrary example pre-emphasis state.

FIG. 1A shows a simplified schematic diagram of one variable pre-emphasis constant output impedance driver 100 in accordance with one exemplary embodiment. The variable pre-emphasis constant output impedance driver 100 can have a bank formed of an arbitrary quantity, for example 10, parallel-connected non-emphasis drivers, such as the examples labeled 102-0, 102-1 ... 102-9, and collectively referenced as "non-emphasis drivers 102." It will be understood that 10 was arbitrarily selected as the quantity of non-emphasis drivers 10. For example another quantity, such as 50, of the selectively enabled non-emphasis drivers 102 could have been used.

Referring still to FIG. 1A, in an embodiment the variable pre-emphasis constant output impedance driver 100 can include a bank of selectively enabled pre-emphasis drivers, such as the examples individually labeled 104-0, 104-1 ... 104-9, and collectively referenced as "selectively enabled pre-emphasis path drivers 104." In an aspect, the bank of non-emphasis drivers 102 can be fed by a non-emphasis path input buffer 106 receiving an input signal TX-In. In a further aspect, the bank of selectively enabled pre-emphasis path drivers 104 can be fed by a pre-emphasis path input buffer 108 that can receive a pre-emphasized input signal PE-In.

In an embodiment the variable pre-emphasis constant output impedance driver 100 can include a pre-emphasis controller 110 that can selectively enable, in this example, any number between 0 and 10 of the 10 selectively enabled non-emphasis drivers 102, while concurrently enabling, in this example, anywhere from 10 down to 0 of the selectively enabled pre-emphasis path drivers 104. For convenient reference in describing example operations, the quantity of enabled non-emphasis drivers 102 will be termed "n" and the total quantity of available selectively enabled non-emphasis drivers 102 will be termed "N." In this example, N is 10. Similarly, the quantity of selectively enabled pre-emphasis path drivers 104 will be termed "m," and the total quantity of selectively enabled pre-emphasis path drivers 104 will be termed "M."

Referring still to FIG. 1A, according to an aspect the outputs of the non-emphasis drivers 102 can be coupled to the outputs of the selectively enabled pre-emphasis path drivers 104, with all feeding a common output node Vout. The Vout signal will therefore be a combination of the contribution of the TX-In signal, amplified by the parallel operation of the n enabled ones of the N selectively enabled non-emphasis drivers 102, and the PE-In signal, amplified by the parallel operation of the in enabled ones of the M selectively enabled pre-emphasis path drivers 104. In an aspect, the circuitry of the selectively enabled non-emphasis drivers 102 and of the selectively enabled pre-emphasis path drivers 104 can be configured to operate, when arranged in parallel, as summing amplifiers. Further to this aspect, as in, the quantity of selectively enabled pre-emphasis path drivers 104 is increased and n, the quantity of enabled non-emphasis drivers 102, is decreased, the level of pre-emphasis of the Vout signal will increase. Conversely, as the value of m, the quantity of selectively enabled pre-emphasis path drivers 104, is decreased, and n, the quantity of enabled non-emphasis drivers, is increased, the level of pre-emphasis decreases. It will be understood that in an aspect the non-emphasis drivers 102 and the selectively enabled pre-emphasis path drivers 104 can be configured to provide a high impedance when disabled so that only the enabled non-emphasis drivers 102 and selectively enabled pre-emphasis path drivers 104 contribute to the total output impedance of the variable pre-emphasis constant output impedance driver 100. Persons of ordinary skill in the art having view of the present disclosure can readily select from conventional driver circuit techniques to implement, without undue experimentation, individual selectively enabled non-emphasis drivers 102 and selectively enabled pre-emphasis path drivers 104 that exhibit a desired enabled state output impedance, which is described in greater detail below, and a much higher disabled state output impedance. Further detailed description of the circuitry of the selectively enabled non-emphasis drivers 102 and selectively enabled pre-emphasis path drivers 104 is therefore omitted.

With continuing reference to FIG. 1A, in one aspect the pre-emphasis controller 110 can be configured to select m and n such that their total is a given constant value P. In other words, the total number of enabled drivers, m+n, will always equal the selected constant value P. According to various exemplary embodiments, the pre-emphasis controller 110 can be configured to select m, the quantity of selectively enabled pre-emphasis path drivers 104 that are enable and n, the quantity of selectively enabled non-emphasis drivers 102 that are enabled such that $$m+n=P \qquad \text{Eqn. (1)}$$

$$m=P-n; \text{ or} \qquad \text{Eqn. (2)}$$

$$n=P-m \qquad \text{Eqn. (3)}$$

In an aspect M can be equal to N. Further to this aspect, P can be equal to the value of M and N. Setting P at this value allows a range of m and n, from setting m to 0 and n to N, to obtain maximum pre-emphasis, to setting m to M and n to 0, to obtain zero pre-emphasis, while obeying Equations (1) to (3), and therefore maintaining the same output impedance. Continuing with the example in which M is chosen equal to N, at an example mid-range setting, m can be selected as M/2 and n as N/2, which provides m+n equal to P.

Referring still to FIG. 1A, in an aspect a desired output impedance, termed "R_Line," can be provided. One example R_Line can be 50 ohms. This is only an example, and not any limitation on the scope of any embodiment or any aspect of the same. For example, R_Line could be 25 ohms, 75 ohms, 100 ohms, or any value spanned by, or outside of these example values. The R_Line can an application-specific line, for example an interface protocol that the system is to meet. In a further aspect, each of the selectively enabled non-emphasis drivers 102 and each of the selectively enabled pre-emphasis path drivers 104 can be configured such that, when enabled, it places an output impedance on the Vout node of P times R_Line. As described, previously in this disclosure, each of the selectively enabled non-emphasis drivers 102 and each of the selectively enabled pre-emphasis path drivers 104 can likewise be configured such that, in the disabled state, it exhibits a much higher output impedance that does not affect the output impedance on the Vout node. Therefore, as will be understood, for any set of values of m and n, the total output impedance, R_effective, the combination of m selectively enabled pre-emphasis path drivers 104 and n enabled non-emphasis drivers 102 place on the Vout node will be $$R\_\text{effective}=(P \times R\_\text{Line})/P=R\_\text{Line} \qquad \text{Eqn. (4).}$$

Referring to FIG. 1A, for purposes of example it will be assumed that the given R_Line is 50 ohms, and it will be assumed that P=10 and, as previously described, that N and M=10. In an aspect, to meet the R_Line of 50 ohms each selectively enabled pre-emphasis path driver 104 can be configured so that, when enabled, it has an output impedance of P×R_effective, in this example 10×50 ohms, which is 500 ohms. Referring again to FIG. 1A, the depicted example state of the N (e.g., 10) selectively enabled non-emphasis drivers 102 is that 3 are enabled, which are shown by solid lines, and 7 are disabled (i.e., not enabled), which are shown by dotted lines. This illustrates an example of n equal to 3. This example state will be alternatively referenced as "state 150A." Also show at FIG. 1A, the depicted example state of the M (e.g., 10) selectively enabled pre-emphasis path drivers 101 is that 7 are enabled and 3 are disabled. This illustrates an example of in equal to 7. This example state will be alternatively referenced as "state 152A." As previously described, solid lines represent the enabled state of the selectively enabled pre-emphasis path drivers 101 and dotted lines represent the disabled, i.e., not enabled state.

With continuing reference to FIG. 1A, in the illustrated state 150A in which 3 of the selectively enabled non-emphasis drivers are enabled and 7 are disabled, i.e., together with the state 152A of 7 of the selectively enabled pre-emphasis path drivers 104 being enabled and 3 being disabled, the total number of enabled devices, i.e., m+n, is 10. Since the example value of P is 10, Equation (1) of m+n=P is satisfied. As previously described, the example R_Line is 50 ohms, and therefore each of the selectively enabled non-emphasis drivers 102 and each of the selectively enabled pre-emphasis path drivers 104 has an output impedance of 500 ohms. Therefore, in the state 150A and in the state 152A the total output impedance of the Vout node is maintained as 10 parallel 500 ohm resistors, which is 50 ohms. With respect to the level of pre-emphasis at the Vout node, this will be determined by the summing operation performed by the 3 enabled non-emphasis drivers 102 together with the summing operation of the 7 enabled pre-emphasis path drivers 104.

Figure 1B:
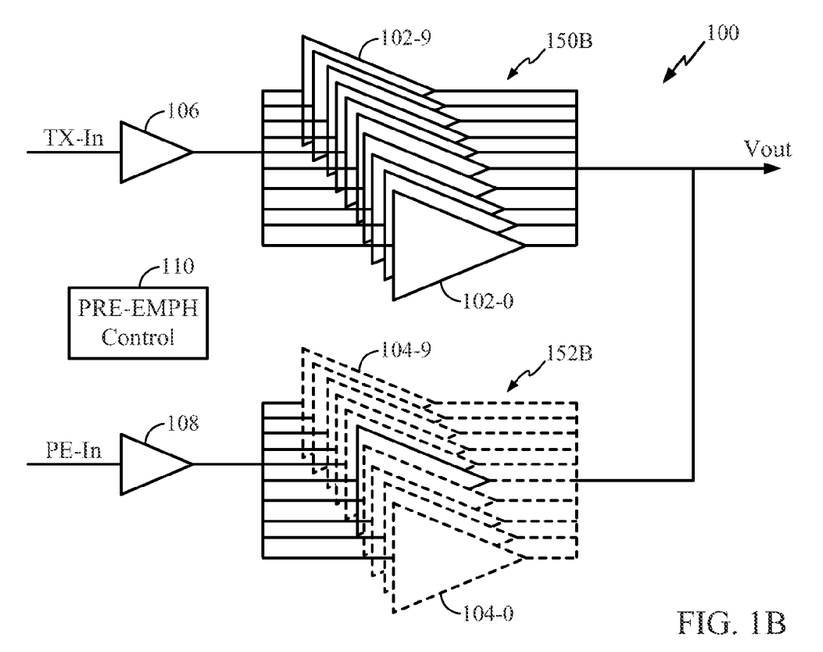
FIG. 1B shows the simplified schematic diagram of the FIG. 1A one example variable pre-emphasis constant output impedance driver in accordance with one exemplary embodiment, having another arbitrary example pre-emphasis state.

FIG. 1B shows a simplified schematic diagram of another example state of the FIG. 1A variable pre-emphasis constant output impedance driver 100 in accordance with one exemplary embodiment. More particularly, FIG. 1B shows the 10 selectively enabled non-emphasis drivers 102 in a state 150B in which all 10 are enabled, i.e., n being equal to 10, and the selectively enabled pre-emphasis path drivers 104 in a state 152B in which none are enabled, in being equal to 0. Therefore, the Vout signal will have zero pre-emphasis. However, the sum of n and m is the same value P achieved by the FIG. 1A stated, i.e., 10. The variable pre-emphasis constant output impedance driver 100 therefore has the same effective output impedance of 10 parallel 500 ohm resistors, i.e., 50 ohms when in the zero pre-emphasis state shown by FIG. 1B as it has in the pre-emphasis state shown by FIG. 1A.

With respect to the signals TX-In and PE-In, in an aspect, the input signal TX-In can be a communication signal, for example a physical layer (PHY), serial/de-serializer (SERDES) signal. The PE-In signal can be a version of the TX-In signal having a given frequency-dependent amplitude characteristic, for example having certain frequency bands amplified, and/or certain frequency bands attenuated. In a further aspect, the PE-In signal can be a training sequence, generated for example in accordance with conventional training sequence channel-scenario testing techniques.

It will be understood, with respect to the term "non-emphasis" appearing in the reference name "selectively enabled non-emphasis drivers 102," that the term is not intended to limit implementations of the selectively enabled non-emphasis drivers 102 to having a flat frequency response over the frequency band of the TX-In signal. Instead, the term "non-emphasis" in the context of "selectively enabled non-emphasis drivers 102" is only for convenience in associating the selectively enabled non-emphasis drivers 102 with their functions in the description of example operations in later sections.

Figure 2:
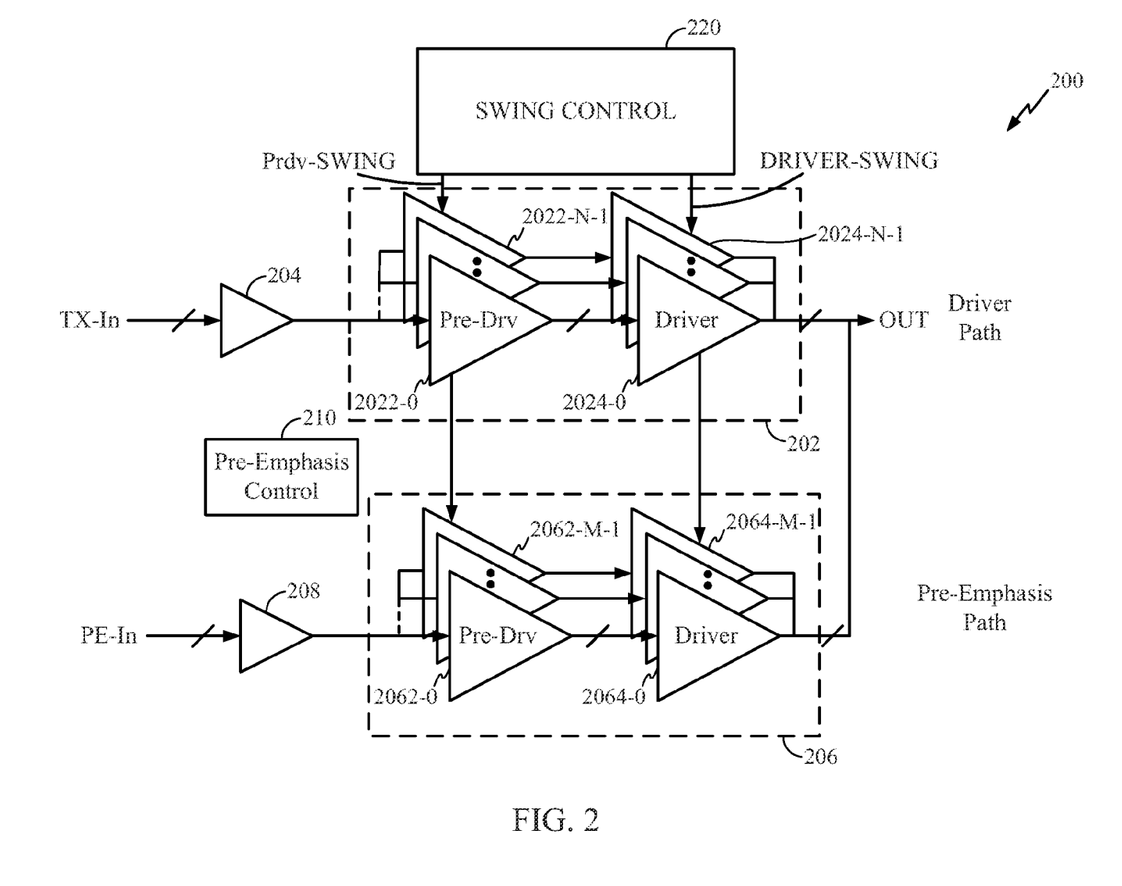
FIG. 2 shows a simplified schematic diagram of one example variable pre-emphasis constant output impedance driver in accordance with a further exemplary embodiment.

FIG. 2 shows a simplified schematic diagram of one example variable pre-emphasis constant output impedance driver 200 in accordance with an exemplary embodiment.

Referring to FIG. 2, in an aspect the variable pre-emphasis constant output impedance driver 200 can include a non-emphasis path 202 receiving at a non-emphasis input buffer 204 a TX-In signal as previously described, and a pre-emphasis path 206 receiving, at a pre-emphasis input buffer 208, a PE-In signal as previously described. In an aspect, the non-emphasis path 202 can be formed of a bank of N pre-driver slices, labeled 2022-0 . . . 2022-N−1 (collectively referenced as "pre-driver slices 2022"), feeding a bank of N variable swing, selectively enabled driver slices, labeled 2024-0 . . . 2024-N−1 (collectively referenced as "variable swing, selectively enabled driver slices 2024"). The pre-emphasis path 206 can be similarly formed of a bank of M pre-driver slices, labeled 2062-0 . . . 2062-M−1 (collectively referenced as "pre-driver slices 2062"), feeding a bank of M, selectively enabled driver slices, labeled 2064-0 . . . 2064-M−1 (collectively referenced as "selectively enabled driver slices 2064").

In an aspect, the variable pre-emphasis constant output impedance driver 200 can include a pre-emphasis control 210. In an aspect, the pre-emphasis control 210 can selectively enable m of the selectively enabled driver slices 2064 of the pre-emphasis path 206, in combination with n of the selectively enabled driver slices 2024 of the non-emphasis path 202. The selective enabling can, for example be in the manner described above in reference to FIGS. 1A and 1B, where the ratio of m to n sets the pre-emphasis level, and by m+n remaining equal to P, the output impedance at Vout remains constant.

Referring still to FIG. 2, in an aspect the circuitry, or portions of the circuitry of the non-emphasis path 202 can be configured substantially identical to the circuitry, or portions of the circuitry of the pre-emphasis path 206.

In an aspect, the example variable pre-emphasis constant output impedance driver 200 can have a swing control 220. The swing control 220 can be, but is not necessarily a conventional gain control, for example applying conventional gain control techniques to the variable swing, selectively enabled driver slices 2024 of the non-emphasis path 202, and the selectively enabled driver slices 2064 of the pre-emphasis path 206.

Figure 3:
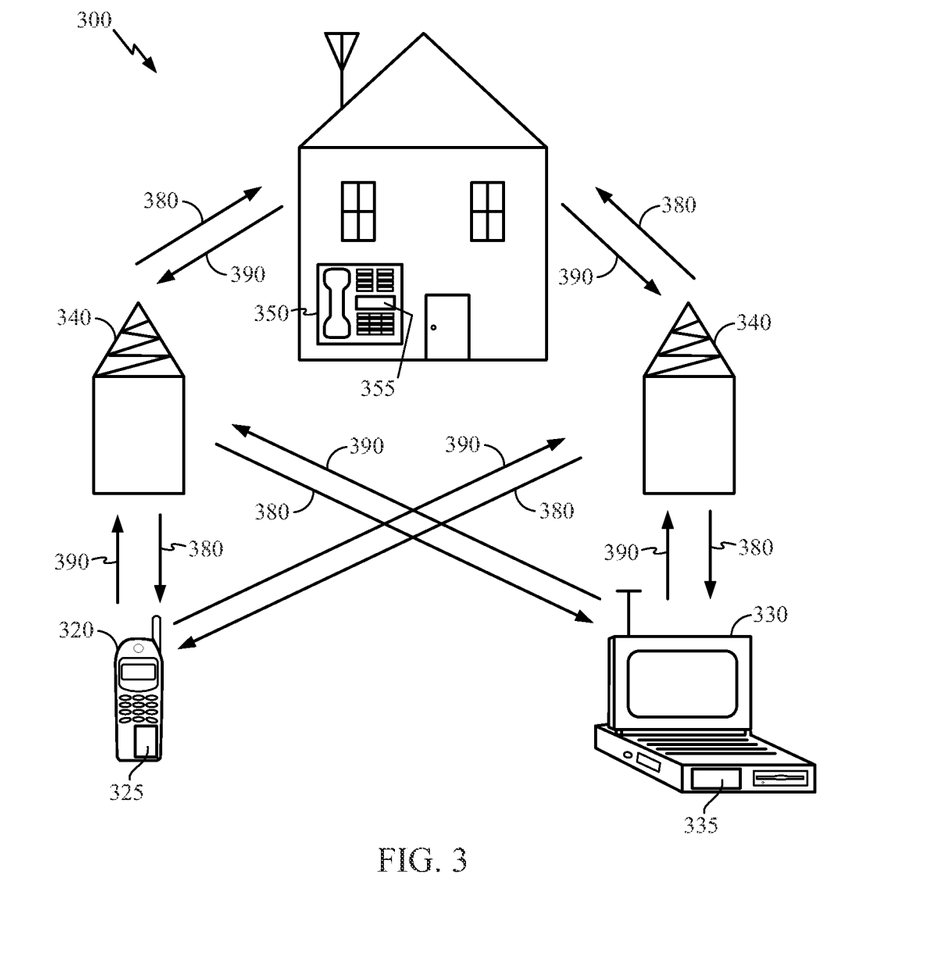
FIG. 3 illustrates an exemplary wireless communication system in which one or more embodiments of the disclosure may be advantageously employed.

FIG. 3 illustrates an exemplary wireless communication system 300 in which one or more embodiments of the disclosure may be advantageously employed. For purposes of illustration, FIG. 3 shows three remote units 320, 330, and 350 and two base stations 340. It will be recognized that conventional wireless communication systems may have many more remote units and base stations. The remote units 320, 330, and 350 include semiconductor devices 325, 335 and 355, which are among embodiments of the disclosure as discussed further below. FIG. 3 shows forward link signals 380 from the base stations 340 and the remote units 320, 330, and 350 and reverse link signals 390 from the remote units 320, 330, and 350 to the base stations 340.

In FIG. 3, the remote unit 320 is shown as a mobile telephone, the remote unit 330 is shown as a portable computer, and the remote unit 350 is shown as a fixed location remote unit in a wireless local loop system. For example, the remote unit may be one or more of a mobile phone, hand-held personal communication systems (PCS) unit, portable data units such as a personal data assistant, navigation devices (such as GPS enabled devices), set top box, music player, video player, entertainment unit, fixed location data unit such as a meter reading equipment, or any other device that stores or retrieves data or computer instructions, or any combination thereof. Although FIG. 3 illustrates remote units according to the teachings of the disclosure, the disclosure is not limited to these exemplary illustrated units. Embodiments of the disclosure may be suitably employed in any device that includes at least one semiconductor die having active integrated circuitry including memory and on-chip circuitry for test and characterization.

In view of exemplary systems shown and described above, methodologies that may be implemented in accordance with the disclosed subject matter, will be better appreciated with reference to various flow charts. While, for purposes of simplicity of explanation, methodologies are shown and described as a series of blocks, it is to be understood and appreciated that the claimed subject matter is not limited by the number or order of blocks, as some blocks may occur in different orders and/or at substantially the same time with other blocks. Moreover, not all illustrated blocks may be required to implement methodologies described herein. It is to be appreciated that functionality associated with blocks may be implemented by software, hardware, a combination thereof or any other suitable means (e.g. device, system, process, or component). Additionally, it should be further appreciated that methodologies disclosed throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram. Further, the various methods disclosed herein can include employing a processor executing computer executable instructions stored on a computer readable storage medium to implement the methods.

It will be appreciated that data store (e.g., memories) components described herein may include or may be implemented using volatile memory, nonvolatile memory, or both. Nonvolatile memory may include or may be implemented with any non-volatile memory technology capable of meeting performance requirements pertaining to the particular memory function implemented, which can be readily ascertained by persons of ordinary skill in the art upon reading this disclosure, and may include, as illustrative but limitative examples, read only memory (ROM), programmable ROM (PROM), electrically programmable ROM (EPROM), electrically erasable ROM (EEPROM), or flash memory. Volatile memory may include or may be implemented with any volatile memory technology capable of meeting performance requirements pertaining to the particular memory function implemented, which can be readily ascertained by persons of ordinary skill in the art upon reading this disclosure, and may include, as illustrative but limitative examples, synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Memory of the various aspects is intended to comprise, without being limited to, these and any other suitable types of memory.

It is to be understood that aspects described, herein may be implemented by hardware, software, firmware or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. In addition, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or an other such configuration. Additionally, at least one processor may comprise one or more modules operable to perform one or more of the steps and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the steps and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

While the foregoing disclosure discusses illustrative aspects and/or embodiments, it should be noted that various changes and modifications could be made herein without departing from the scope of described aspects and/or embodiments as defined by the appended claims. Accordingly, described aspects are intended to embrace all such alterations, modifications and variations that fall within scope of appended claims. Furthermore, although elements of described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for pre-emphasis drive, comprising:
    driving a driver output according to a given pre-emphasis at a given output impedance, by driving a driver output with a population of n drivers in parallel to the driver output and a concurrent population of m pre-emphasis path drivers in parallel to the driver output, wherein the sum of n and m is P, wherein the ratio of n to m is based on the given pre-emphasis, and wherein each of the m pre-emphasis drivers has an output impedance of P times the given output impedance and wherein each of the n drivers has an output impedance of P times the given output impedance; and
    driving the driver output according to an updated pre-emphasis at said given output impedance, by updating the population of pre-emphasis path drivers from m to m' and the population of drivers from n to n', wherein said updating updates m to m' in an inverse relation to the updating of n to n' such that the sum of n' and m' is maintained at approximately P, and wherein the ratio of n' to m' is based on the updated pre-emphasis.

2. The method of claim 1, wherein the drivers and the pre-emphasis path drivers are voltage mode drivers.

3. The method of claim 1, wherein driving the driver output with the population of n drivers and the concurrent population of m pre-emphasis path drivers in parallel to the driver output comprises
    providing a plurality greater than or equal to n of selectively enabled non-emphasis drivers in parallel and a plurality greater than or equal to m of selectively enabled pre-emphasis drivers in parallel, and
    enabling m among the selectively enabled pre-emphasis path drivers and n among the selectively enabled pre-emphasis path drivers, and wherein
    driving the driver output according to an updated pre-emphasis at said given output impedance comprises
        updating the enabling of the drivers by enabling n' from among the plurality of selectively enabled drivers, and
    updating the enabling population of the pre-emphasis path drivers by enabling m' from among the plurality of selectively enabled pre-emphasis path drivers.

4. A variable pre-emphasis, constant output impedance line driver, comprising:
    a bank of parallel, selectively enabled drivers having respective outputs coupled to an output node, configured to receive a signal and, if enabled, feed the output node;
    a bank of parallel, selectively enabled pre-emphasis path drivers having respective outputs coupled to the output node, configured to receive a pre-emphasis signal and, if enabled, feed the output node, wherein the selectively enabled pre-emphasis path drivers are configured to have an output impedance approximately equal to P times R_Line if enabled and to have an output impedance significantly greater than P times R_Line if not enabled; and
    a pre-emphasis controller configured to receive a pre-emphasis command and, in response, enable m of the selectively enabled pre-emphasis path drivers and n of the selectively enabled drivers, wherein m and n are in accordance with the pre-emphasis command, and wherein m+n=P such that the output impedance at the output node is approximately R_Line,
    wherein the pre-emphasis controller is configured to receive an updated pre-emphasis command and, based on the updated pre-emphasis command, update m to m' and n to n' and, in response, enable m' of the selectively enabled pre-emphasis path drivers and n' of the selectively enabled drivers, wherein m' and n' establish an updated pre-emphasis and m'+n'=P such that the output impedance at the updated pre-emphasis is maintained at approximately R_Line.

5. The variable pre-emphasis, constant output impedance line driver of claim 4, wherein the selectively enabled drivers and the selectively enabled pre-emphasis path drivers are voltage mode drivers.

6. The variable pre-emphasis, constant output impedance line driver of claim 4, wherein the variable pre-emphasis, constant output impedance line driver is integrated in at least one semiconductor die.

7. The variable pre-emphasis, constant output impedance line driver of claim 4, further comprising a device, selected from the group consisting of a set top box, music player, video player, entertainment unit, navigation device, communications device, personal digital assistant (PDA), fixed location data unit, and a computer, into which the variable pre-emphasis, constant output impedance line driver is integrated.

8. A method for pre-emphasis drive comprising:
    step of driving a driver output according to a given pre-emphasis at a given output impedance, wherein said step comprises driving a driver output with a population of n drivers in parallel to the driver output and a concurrent a population of m pre-emphasis path drivers in parallel to the driver output, wherein the sum of n and m is P, wherein the ratio of n to m is based on the given pre-emphasis, and wherein each of the m pre-emphasis drivers has an output impedance of P times the given output impedance and wherein each of the n drivers has an output impedance of P times the given output impedance; and
    step of driving the driver output according to an updated pre-emphasis at said given output impedance, by updating the population of pre-emphasis path drivers from m to m' and the population of drivers from n to n', wherein said updating updates m to m' in an inverse relation to the updating of n to n' such that the sum of n' and m' is maintained at approximately P, and wherein the ratio of n' to m' is based on the updated pre-emphasis.

9. An apparatus for pre-emphasis, comprising:
    a population of selectively enabled drivers in parallel to a driver output, wherein each of the selectively enabled drivers is configured to have an output impedance, when enabled, of P times a given output impedance;
    a population of selectively enabled pre-emphasis path drivers in parallel to the driver output, wherein each of the selectively enabled pre-emphasis path drivers is configured to have an output impedance, when enabled, of P times the given output impedance;

means for driving the driver output according to a given pre-emphasis at a given output impedance, by driving the driver output with n of the selectively drivers concurrently with m of the selectively enabled pre-emphasis path drivers, wherein the sum of n and m is P, wherein the ratio of n to m is based on the given pre-emphasis; and means for driving the driver output according to an updated pre-emphasis at said given output impedance, by updating the population of pre-emphasis path drivers from m to m' and the population of drivers from n to n', wherein said updating updates m to m' in an inverse relation to the updating of n to n' such that the sum of n' and m' is maintained at approximately P, and wherein the ratio of n' to m' is based on the updated pre-emphasis.

10. The apparatus of claim 9, wherein the apparatus is integrated in at least one semiconductor die.

11. The apparatus claim 9, further comprising a device, selected from the group consisting of a set top box, music player, video player, entertainment unit, navigation device, communications device, personal digital assistant (PDA), fixed location data unit, and a computer, into which the apparatus is integrated.

12. A computer-readable non-transitory medium comprising instructions, which, when executed by a processor apparatus coupled to a bank of parallel, selectively enabled drivers coupled to a driver output, each driver having an output impedance of P times a given output impedance when enabled, and to a bank of parallel, selectively enabled pre-emphasis path drivers coupled to the driver output, each pre-emphasis driver having an output impedance of P times the given output impedance when enabled, cause the processor apparatus to perform operations carrying out a method for pre-emphasis, comprising instructions that cause the processor apparatus to:

drive the driver output according to a given pre-emphasis at the given output impedance, by enabling n of the selectively enabled drivers in parallel to the driver output and concurrently enabling m of the selectively enabled pre-emphasis path drivers in parallel to the driver output, wherein the sum of n and m is P, wherein the ratio of n to m is based on the given pre-emphasis; and drive the driver output according to an updated pre-emphasis at said given output impedance, by updating the population of pre-emphasis path drivers from m to m' and updating the population of drivers from n to n', wherein said updating updates m to m' in an inverse relation to the updating of n to n' such that the sum of n' and m' is maintained at approximately P, and wherein the ratio of n' to m' is based on the updated pre-emphasis.

\* \* \* \* \*